United States Patent
Murai

(10) Patent No.: US 7,136,133 B2
(45) Date of Patent: Nov. 14, 2006

(54) ACTIVE MATRIX SUBSTRATE, LIQUID CRYSTAL DISPLAY APPARATUS HAVING THE SAME, AND METHOD FOR MANUFACTURING THE SAME

(75) Inventor: Atsuhito Murai, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/638,391

(22) Filed: Aug. 12, 2003

(65) Prior Publication Data

US 2004/0036830 A1    Feb. 26, 2004

(30) Foreign Application Priority Data

Aug. 20, 2002    (JP)    ............... 2002-238860

(51) Int. Cl.
*G02F 1/1345*    (2006.01)
(52) U.S. Cl. .................................... 349/149
(58) Field of Classification Search ......... 349/149–152
See application file for complete search history.

(56) References Cited

U.S. PATENT DOCUMENTS

| | | | |
|---|---|---|---|
| 5,523,866 A | 6/1996 | Morimoto et al. | ............ 349/43 |
| 6,190,934 B1 | 2/2001 | Kang et al. | ............... 438/30 |
| 6,373,546 B1* | 4/2002 | Kim | ........................ 349/152 |
| 2002/0018176 A1* | 2/2002 | Kobayashi et al. | ......... 349/200 |
| 2002/0105263 A1 | 8/2002 | Kim | ........................ 313/498 |

FOREIGN PATENT DOCUMENTS

JP    6-51349    2/1994

* cited by examiner

*Primary Examiner*—Dung T. Nguyen
(74) *Attorney, Agent, or Firm*—Nixon & Vanderhye P.C.

(57) ABSTRACT

An active matrix substrate includes: an insulative substrate; an insulating film provided on a layer of line terminals on the insulative substrate and including a contact hole extending in the terminal arrangement direction so that the plurality of line terminals are exposed therethrough; and a plurality of conductive terminal pads provided on a layer of the insulating film on the insulative substrate so as to respectively cover the plurality of line terminals exposed through the contact hole in the insulating film. Signal input terminals are provided, each including one of the line terminals and a corresponding one of the terminal pads.

10 Claims, 17 Drawing Sheets

ACTIVE MATRIX SUBSTRATE, LIQUID CRYSTAL DISPLAY APPARATUS HAVING THE SAME, AND METHOD FOR MANUFACTURING THE SAME

BACKGROUND OF THE INVENTION

1. Field of the Invention

The present invention relates to an active matrix substrate including a plurality of spaced-apart signal input terminals for providing connection to the driver, a liquid crystal display apparatus having the same, and a method for manufacturing the same.

2. Description of the Prior Art

With the recent advent of the information-oriented society, there is a rapidly-increasing demand for notebook computers, PDAs (personal digital assistants), car navigation systems, and the like. Accordingly, displays for use with these new technologies, such as liquid crystal display apparatuses, have been actively researched and developed. Among various types of displays, the most widespread is the liquid crystal display apparatuses. A liquid crystal display device used in a liquid crystal display apparatus selectively drives picture element electrodes arranged in a matrix pattern to form a display pattern on the screen. Specifically, a voltage is applied between each picture element electrode that is being selected and a counter electrode opposing the picture element electrodes to optically modulate a portion of a display medium such as a liquid crystal material that is present between these electrodes, whereby a display pattern is visually recognized. With an active matrix driving method, among other methods for driving the picture element electrodes, independent picture element electrodes arranged on an insulative substrate are driven by turning ON/OFF the switching device provided in each picture element electrode. The substrate on which the picture element electrodes and the switching devices are provided is commonly called an "active matrix substrate". As the switching devices used for the selective driving of the picture element electrodes, thin film transistors (hereinafter referred to as "TFTs"), MIM (metal-first insulating film-metal), etc., are commonly known in the art.

More recently, flexible displays have been actively researched and developed, aiming at reducing the weight of a display module, improving the durability thereof, etc. For flexible displays, plastic and stainless steel boards have been used as the mother board of the active matrix substrate.

FIG. 17 illustrates a liquid crystal display device 12 using a common conventional active matrix substrate 9. In the liquid crystal display device 12, a counter substrate 8 including color filters, counter electrodes, etc., (not shown) formed thereon, and the active matrix substrate 9 including source bus lines, gate bus lines, pixel electrodes, switching devices, etc., (not shown) formed thereon, are provided so as to oppose each other, with a liquid crystal material (not shown) sealed within the gap between the substrate 8 and 9. In the frame area of the active matrix substrate 9, gate signal input terminals 10a are provided at one end of the gate bus lines, and source signal input terminals 10b are provided at one end of the source bus lines.

FIG. 10A is a plan view illustrating signal input terminals 10 of the conventional active matrix substrate 9, FIG. 10B is a cross-sectional view taken along line XB—XB of FIG. 10A, and FIG. 10C is a cross-sectional view taken along line XC—XC of FIG. 10A.

As illustrated in FIG. 10A to FIG. 10C, in the conventional active matrix substrate 9, a plurality of line terminals 2 made of a gate metal or a source metal are provided on an insulative substrate 1, an insulating film 13 is provided thereon with contact holes 7 therein corresponding to the line terminals 2, and terminal pads 4 are formed so as to cover the corresponding contact holes 7. Each terminal pad 4 is electrically connected with the corresponding line terminal 2 to form the signal input terminal 10.

A method for manufacturing the conventional active matrix substrate 9 will be described with reference to FIG. 11A to FIG. 11C (corresponding to FIG. 10A), FIG. 12A to FIG. 12C (corresponding to FIG. 10B, taken along line XB—XB of FIG. 10A), and FIG. 13A to FIG. 13C (corresponding to FIG. 10C, taken along line XC—XC of FIG. 10A).

As illustrated in FIG. 11A, FIG. 12A and FIG. 13A, the active matrix substrate 9 is manufactured by first depositing a metal film made of Cr, for example, on the insulative substrate 1 made of a glass, or the like, by a sputtering method, or the like, and then forming the line terminals 2 by a photolithography method, or the like. A gas barrier layer or a water barrier layer may be provided (not shown) on the insulative substrate 1, as necessary.

Then, as illustrated in FIG. 11B, FIG. 12B and FIG. 13B, the insulating film 13 made of SiNx, or the like, is deposited on the line terminals 2 by a CVD method, or the like, and the contact holes 7 are formed so as to correspond to the line terminals 2 by a photolithography method.

Then, as illustrated in FIG. 11C, FIG. 12C and FIG. 13C, ITO, Al, or the like, for example, is deposited by a sputtering method, and the terminal pads 4 are formed so as to cover the contact holes 7 by a photolithography method.

In the conventional active matrix substrate 9 as described above, when a glass, a silicon wafer, or the like, whose thermal expansion coefficient is small and which undergoes little dimensional change by absorbing water, etc., is used as the insulative substrate 1, the line terminals 2, the contact holes 7 and the terminal pads 4 can be patterned with a high precision, i.e., with substantially no mis-photoalignment, in a photolithography process by an ordinary exposure method using a photomask. However, when the insulative substrate 1 is a so-called "plastic substrate" whose thermal expansion coefficient is larger and which undergoes more dimensional change by absorbing water, etc., than a glass substrate, e.g., a substrate whose main component is polyimide, polycarbonate, polyethylene terephthalate, an epoxy resin, an acrylic resin, polyethylene sulfonate, or a derivative thereof, the line terminals 2, the contact holes 7 and the terminal pads 4 cannot be patterned with a high precision, i.e., with little mis-photoalignment. Therefore, the contact holes 7 and/or the terminal pads 4 may be substantially misaligned with the line terminals 2, as illustrated in FIG. 16A and FIG. 16B.

Specifically, when a panel is produced by using a glass substrate (linear expansion coefficient $\alpha$: $3.6\times10^{-6}$/K) as the insulative substrate 1, the dimensional change, i.e., the amount of misalignment, is 0.5 μm or less (5 ppm or less), whereas with a plastic substrate, e.g., polyethylene sulfonate ($\alpha$: $77\times10^{-6}$/K), the total amount of misalignment including the thermal linear expansion and the dimensional change by absorbing water is 20 to 50 μm (200 to 500 ppm, or more in some cases). As a result, it is not possible to ensure a sufficient contact area between the line terminals 2 and the terminal pads 4, thereby increasing the contact resistance therebetween. This leads to an increase in the contact resistance between the line terminals 2 and the terminal pads 4, a connection defect therebetween, a driver mounting defect, and thus a display defect.

Moreover, when a plastic substrate as described above is used as the insulative substrate 1 in a structure having the contact holes 7 as in the prior art, the stress is concentrated near each corner of a portion of the insulating film 13 corresponding to the contact hole 7 due to, for example, flexure of the insulative substrate 1 when mounting the driver for driving the liquid crystal panel, thereby causing a crack.

SUMMARY OF THE INVENTION

It is an object of the present invention to provide an active matrix substrate in which it is possible to provide a large photoalignment margin for terminal pads with respect to the terminal arrangement direction and to prevent a crack from occurring in an insulating film due to flexure of an insulative substrate when mounting the driver for driving the liquid crystal panel, a method for manufacturing the same, and a liquid crystal display apparatus having the same.

An active matrix substrate of the present invention, which achieves the object set forth above, is an active matrix substrate including a plurality of spaced-apart signal input terminals for providing connection to a driver, the active matrix substrate including:

an insulative substrate;

a plurality of spaced-apart conductive line terminals provided on the insulative substrate;

an insulating film provided on a layer of the line terminals on the insulative substrate and including a contact hole extending in a terminal arrangement direction so that the plurality of line terminals are exposed therethrough; and a plurality of conductive terminal pads provided on a layer of the insulating film on the insulative substrate so as to respectively cover the plurality of line terminals exposed through the contact hole in the insulating film, wherein the signal input terminals each include one of the line terminals and a corresponding one of the terminal pads.

With such a structure, the contact hole extends in the terminal arrangement direction so that all of the line terminals are exposed therethrough, whereby in the patterning step for forming the terminal pads by a photolithography method, it is possible to provide a large photoalignment margin for the terminal pads with respect to the terminal arrangement direction.

Moreover, since the contact hole is formed so that all of the line terminals are exposed therethrough, the concentration of a stress on the insulating film due to, for example, flexure of the insulative substrate is relieved, whereby a crack is unlikely to occur in the insulating film. Therefore, even when a plastic substrate is used as the insulative substrate, it is possible to prevent a crack or peeling-off from occurring in the insulating film in the driver-mounting area due to flexure of the insulative substrate when mounting the driver for driving the liquid crystal panel.

In one embodiment of the present invention, a length of each terminal pad in a direction perpendicular to the terminal arrangement direction is larger than a width of the contact hole.

In this way, the length of each terminal pad in the direction perpendicular to the terminal arrangement direction is larger than the width of the contact hole, whereby it is possible to provide a sufficient photoalignment margin for the terminal pads with respect to the direction perpendicular to the terminal arrangement direction, thus making the process of forming the terminal pads substantially free of photoalignment.

In one embodiment of the present invention, side edges of the line terminal of each signal input terminal opposing each other in the terminal arrangement direction are aligned with those of the terminal pad of the signal input terminal.

Such a structure where the side edges of the line terminal opposing each other in the terminal arrangement direction are aligned with those of the terminal pad can be obtained by forming a plurality of spaced-apart terminal pads on a line terminal forming film, which is a single-piece member to be later divided into individual line terminals, and then etching away the non-terminal-pad portions of the line terminal forming film by using the terminal pads themselves or the photopattern that is used for forming the terminal pads as a mask. Therefore, it is possible to provide a large photoalignment margin for the terminal pads with respect to the terminal arrangement direction and further to ensure a constant and sufficient contact area between the line terminals and the terminal pads, thereby achieving a sufficiently small contact resistance therebetween. Thus, it is possible to obtain the signal input terminals in which a connection defect between the line terminal and the terminal pad is unlikely to occur even when the insulative substrate expands/contracts.

In one embodiment of the present invention, the insulative substrate is a plastic substrate.

A plastic substrate has a large linear expansion coefficient and undergoes substantial expansion/contraction in response to a change in the temperature. Therefore, where a plastic substrate is used, the advantage of the present invention that it is possible to provide a large photoalignment margin for the terminal pads with respect to the terminal arrangement direction is particularly pronounced.

A liquid crystal display apparatus of the present invention includes an active matrix substrate as described above.

A method for manufacturing an active matrix substrate of the present invention as described above is a method for manufacturing an active matrix substrate including a plurality of spaced-apart signal input terminals for providing connection to a driver, the method including the steps of:

forming a conductive elongate line terminal forming film on an insulative substrate;

forming an insulating film so as to cover the line terminal forming film on the insulative substrate;

forming an elongate contact hole in the insulating film so that the line terminal forming film is exposed therethrough;

forming a plurality of conductive terminal pads on the line terminal forming film exposed through the contact hole in the insulating film so that the terminal pads are spaced apart from one another in a longitudinal direction of the line terminal forming film; and selectively removing the non-terminal-pad portions of the line terminal forming film, thereby forming a plurality of spaced-apart line terminals while forming the signal input terminals each including one of the line terminals and a corresponding one of the terminal pads.

BRIEF DESCRIPTION OF THE DRAWINGS

The above and other objects, advantages and features of the invention will become apparent from the following description when taken in conjunction with the accompanying drawings, in which:

FIG. 5A to FIG. 8D are cross-sectional views taken along line VC—VC of FIG. 5A, illustrating the process of manufacturing the active matrix substrate according to Embodiment 2 of the present invention;

DETAILED DESCRIPTION OF THE PREFERRED EMBODIMENTS

The preferred embodiments of the present invention will now be described with reference to the accompanying drawings.

Embodiment 1

Figure 1A:
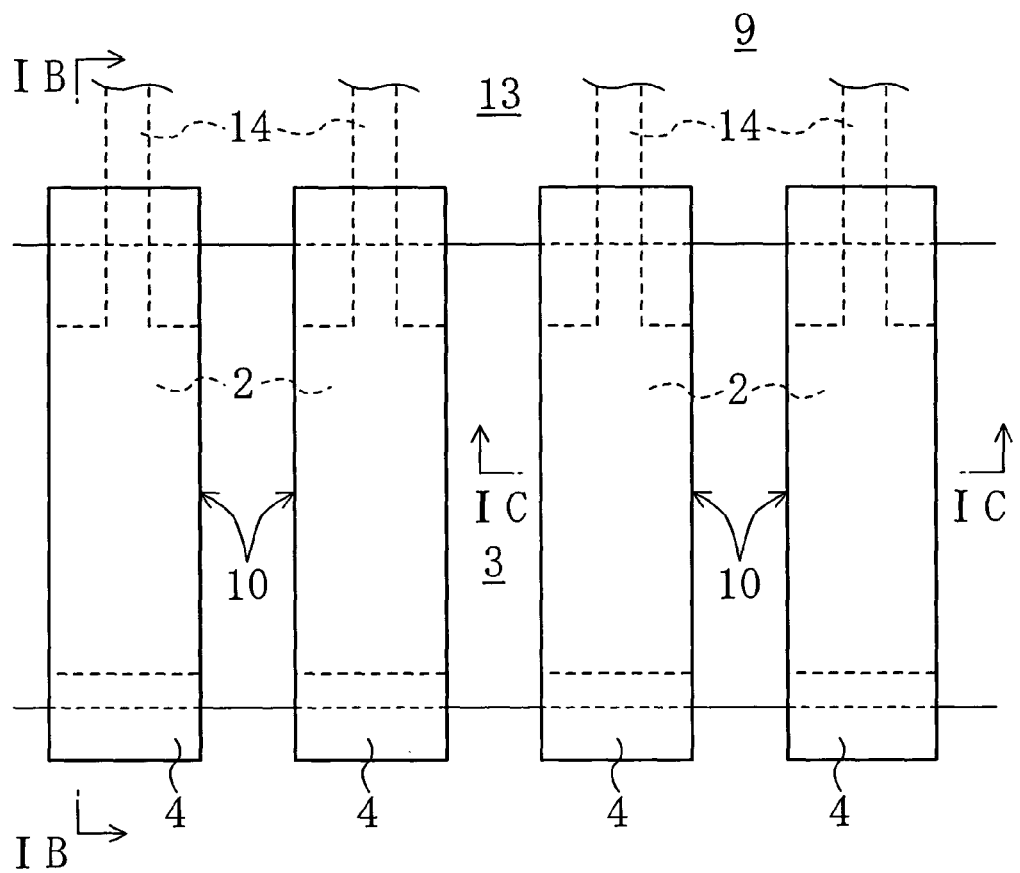
FIG. 1A is an enlarged plan view illustrating a signal input terminal section of an active matrix substrate according to Embodiment 1 of the present invention.
Figure 1B:
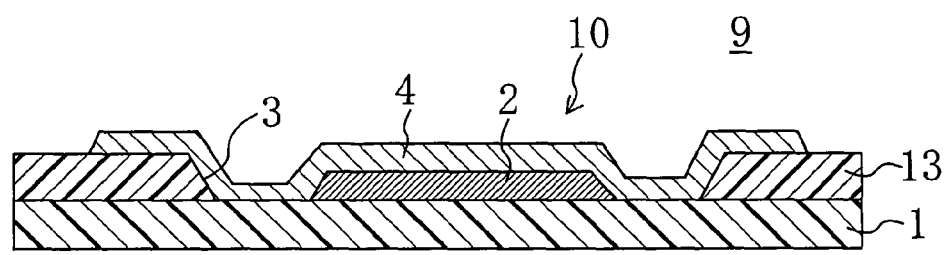
FIG. 1B is a cross-sectional view taken along line IB—IB of FIG. 1A.
Figure 1C:
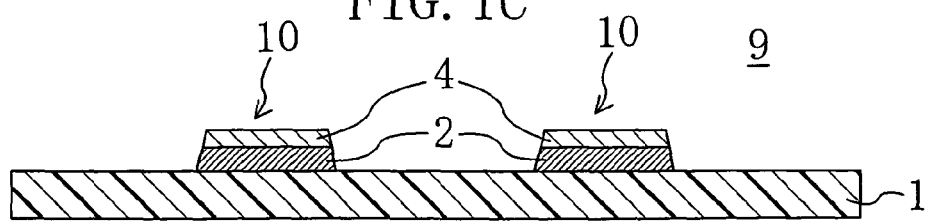
FIG. 1C is a cross-sectional view taken along line IC—IC of FIG. 1A.

The active matrix substrate 9 of Embodiment 1 of the present invention will now be described with reference to FIG. 1A to FIG. 1C. FIG. 1A to FIG. 1C are enlarged views illustrating the signal input terminals 10 of the active matrix substrate 9 of Embodiment 1, wherein FIG. 1A is a plan view, FIG. 1B is a cross-sectional view taken along line IB—IB of FIG. 1A, and FIG. 1C is a cross-sectional view taken along line IC—IC of FIG. 1A.

First, the structure of the active matrix substrate 9 will be described. In the active matrix substrate 9, the gate bus lines 14 made of Ti, source bus lines made of Ti, picture element electrodes, TFTs, etc., (not shown) are formed on the insulative substrate 1 made of polyimide, or the like. The signal input terminals 10 for providing connection to the driver are provided at one end of the gate bus lines 14. The signal input terminals 10 each have a rectangular shape whose long side extends parallel to the gate bus line 14. Similarly, signal input terminals are provided at one end of the source bus lines.

The active matrix substrate 9 further includes the conductive line terminals 2, the insulating film 13, and the conductive terminal pads 4, as illustrated in FIG. 1A to FIG. 1C. The line terminals 2 are arranged at a regular pitch on the insulative substrate 1. The insulating film 13 is provided on the layer of the line terminals 2 on the insulative substrate 1 and includes an elongate strip-shaped contact hole 3 extending in the terminal arrangement direction (along the short side of the terminals) so that all of the line terminals 2 are exposed therethrough. The terminal pads 4 are formed on the layer of the insulating film 13 on the insulative substrate 1 so as to cover the respective line terminals 2 exposed through the strip-shaped contact hole 3. Each signal input terminal 10 includes the line terminal 2 and the terminal pad 4 deposited thereon. The line terminal 2 and the terminal pad 4 are both rectangular in shape, with the length of the long side of the terminal pad 4 being larger than that of the line terminal 2, and the length of the short side, i.e., the width, of the terminal pad 4 being equal to that of the line terminal 2. The side edges of the line terminal 2 opposing each other in the width direction are aligned with those of the terminal pad 4.

As described above, the active matrix substrate 9 includes the elongate strip-shaped contact hole 3 extending in the terminal arrangement direction so that all of the line terminals 2 are exposed therethrough. Therefore, in the patterning process for forming the terminal pads 4 by a photolithography method, it is possible to provide a large photoalignment margin for the terminal pads 4 with respect to the terminal arrangement direction.

Moreover, the length of the long side of the terminal pad 4 to which the line terminal 2 is electrically connected is sufficiently larger than the width of the strip-shaped contact hole 3. Therefore, it is possible to provide a sufficient photoalignment margin for the terminal pads 4 with respect to the longitudinal direction, thereby making the process of forming the terminal pads 4 substantially free of photoalignment.

Moreover, the strip-shaped contact hole 3 is formed so that all of the line terminals 2 are exposed therethrough. Therefore, even when a plastic substrate is used as the insulative substrate 1, it is possible to prevent a crack or peeling-off from occurring in the insulating film 13 in the driver-mounting area due to flexure of the insulative substrate 1 when mounting the driver for driving the liquid crystal panel.

Moreover, the side edges of the line terminal 2 opposing each other in the terminal arrangement direction are aligned with those of the terminal pad 4. As will be described later in greater detail, such a structure is achieved by first forming the terminal pads 4 on a strip-shaped line terminal forming film 2', and then etching away non-terminal-pad portions (portions where terminal pads are not formed) of the line terminal forming film 2' by using the terminal pads 4 themselves or the photopattern that is used for forming the terminal pads 4 as a mask. Therefore, it is possible to provide a large photoalignment margin for the terminal pads 4 with respect to the terminal arrangement direction and further to ensure a constant and sufficient contact area between the line terminals 2 and the terminal pads 4, thereby achieving a sufficiently small contact resistance therebetween. Thus, it is possible to obtain the signal input terminals 10 in which a connection defect between the line terminal 2 and the terminal pad 4 is unlikely to occur even when the insulative substrate 1 expands/contracts.

Next, the formation of the signal input terminals 10 (for the gate bus lines 14) in the method for manufacturing the active matrix substrate 9 will be described with reference to FIG. 2A to FIG. 2D, FIG. 3A to FIG. 3C (taken along line IB—IB of FIG. 1A) and FIG. 4A to FIG. 4C (taken along line IC—IC of FIG. 1A).

Figure 2A:
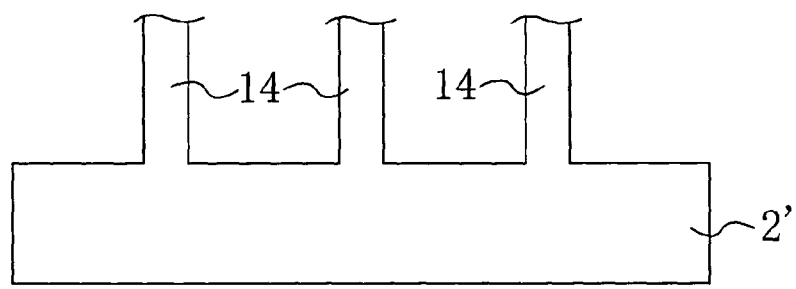
FIG. 2A to FIG. 2D are plan views illustrating the process of manufacturing the active matrix substrate according to Embodiment 1 of the present invention.
Figure 3A:
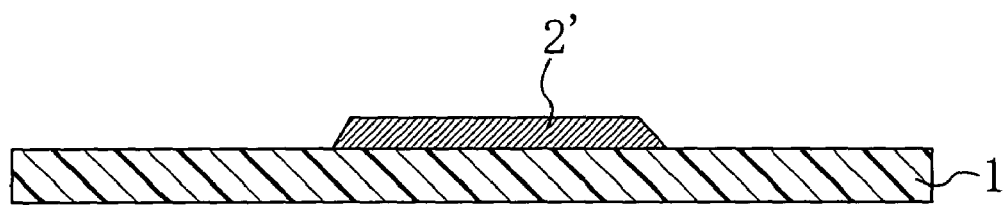
FIG. 3A to FIG. 3C are cross-sectional views taken along line IB—IB of FIG. 1A, illustrating the process of manufacturing the active matrix substrate according to Embodiment 1 of the present invention.
Figure 4A:
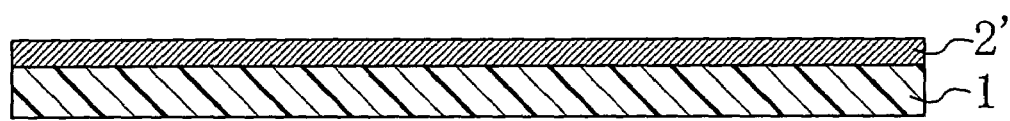
FIG. 4A to FIG. 4C are cross-sectional views taken along line IC—IC of FIG. 1A, illustrating the process of manufacturing the active matrix substrate according to Embodiment 1 of the present invention.

First, as illustrated in FIG. 2A, FIG. 3A and FIG. 4A, Ti is deposited to a thickness of about 150 nm by a sputtering method on the insulative substrate 1 made of polyimide, or the like, and the gate bus lines 14 and storage capacitor lines (not shown) are formed by a photolithography method using an $HNO_3$—HF etchant. In this step, the strip-shaped line terminal forming film 2' is formed at one end of the gate bus lines 14. The line terminal forming film 2' is a single-piece member, which is later divided into the individual line terminals 2. Note that the material of the line terminal forming film 2' is not limited to Ti. The material of the line terminal forming film 2' may be Ti, an alloy thereof, ITO (or any other suitable conductive metal oxide), Ta, Mo, Al, or an alloy thereof, or the line terminal forming film 2' may be a laminate of two or more of these materials.

Then, the gate insulating film (350 nm) 13 made of SiNx, a channel layer (150 nm) made of a-Si and a contact layer made of $n^+$-Si are deposited by a CVD method, and the channel layer and the contact layer are patterned (not shown) by a photolithography method and dry etching using an $SF_6$ gas. Through this step, the channel layer and the contact layer on the line terminal forming film 2' are removed, leaving the gate insulating film 13 (not shown).

Figure 2B:
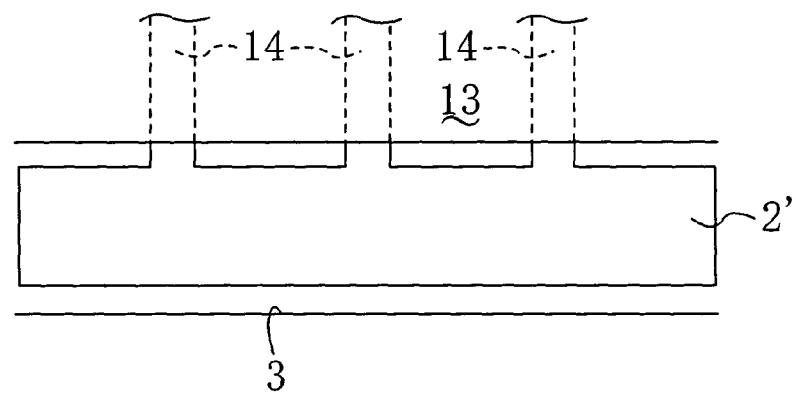
Figure 3B:
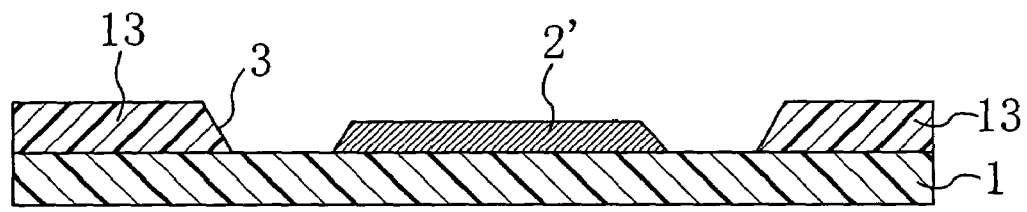
Figure 9A:
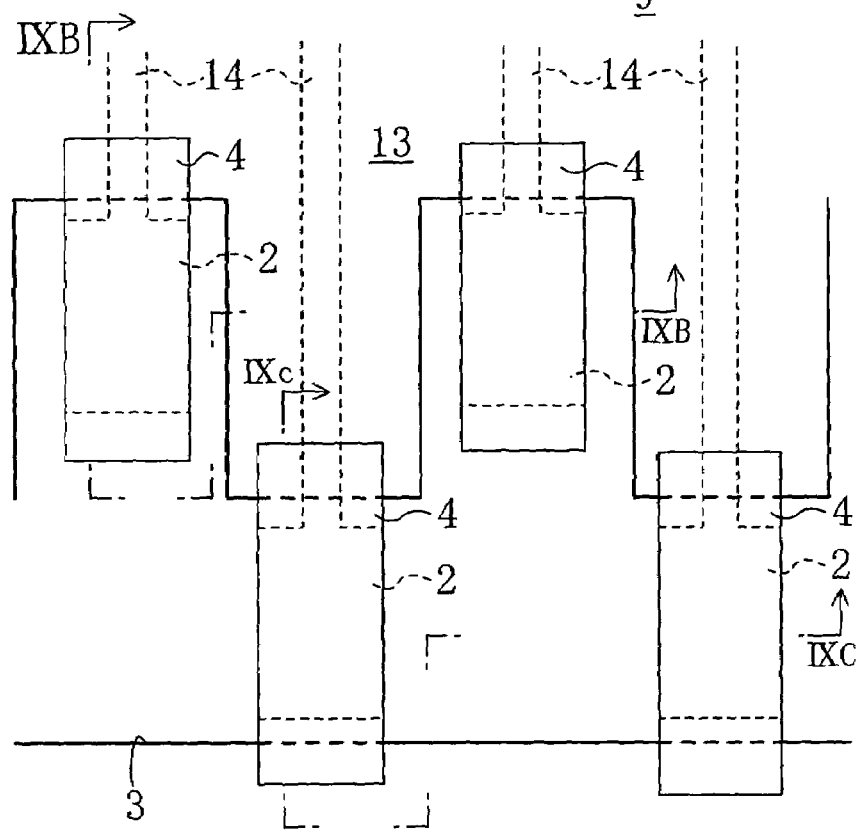
FIG. 9A is an enlarged plan view illustrating a signal input terminal section of an active matrix substrate according to an alternative embodiment of the present invention.
Figure 9B:
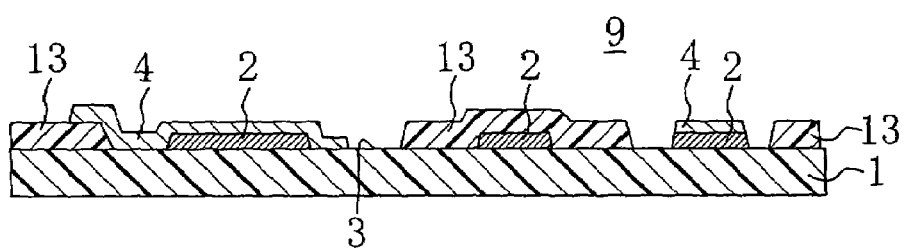
FIG. 9B is a cross-sectional view taken along line IXB—IXB of FIG. 9A.
Figure 9C:
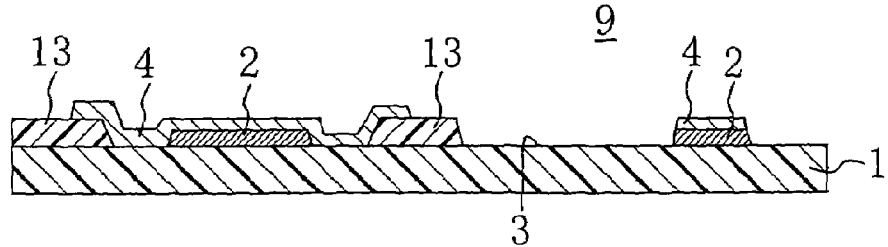
FIG. 9C is a cross-sectional view taken along line IXC—IXC of FIG. 9A.
Figure 10A:
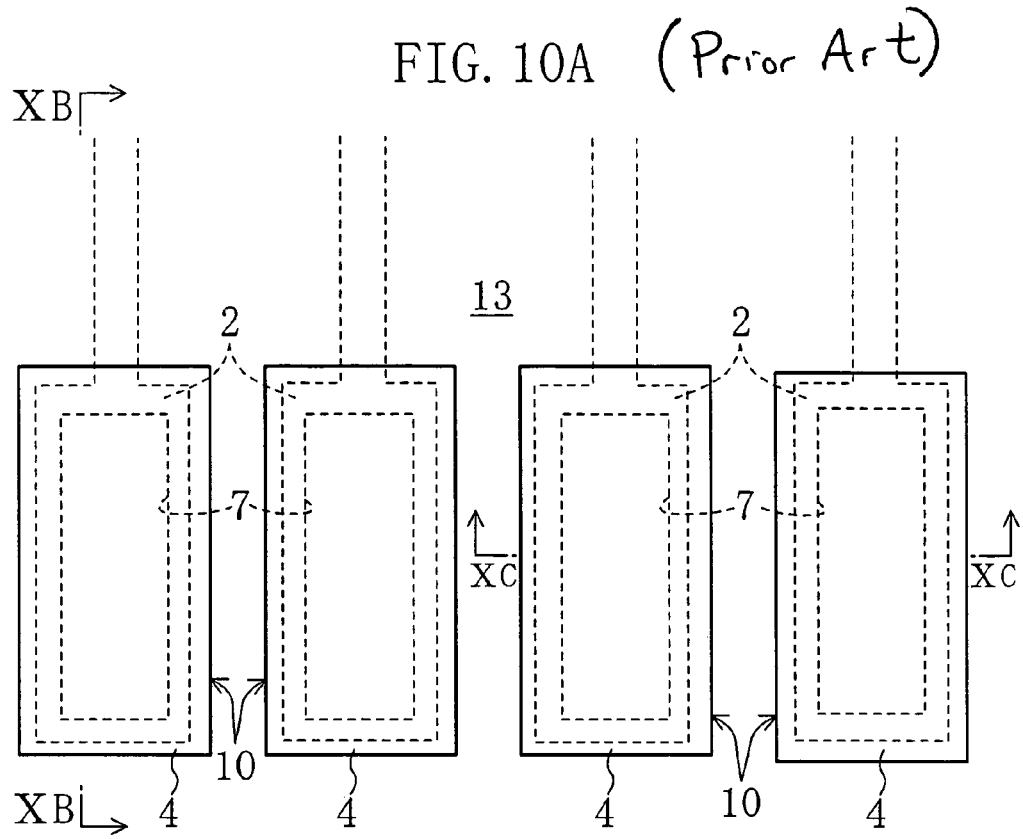
FIG. 10A is an enlarged plan view illustrating a signal input terminal section of a conventional active matrix substrate.
Figure 10B:
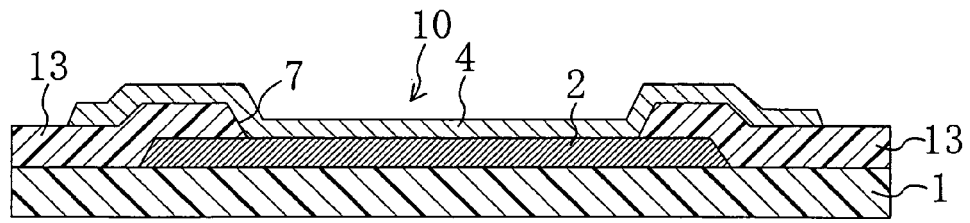
FIG. 10B is a cross-sectional view taken along line XB—XB of FIG. 10A.
Figure 10C:
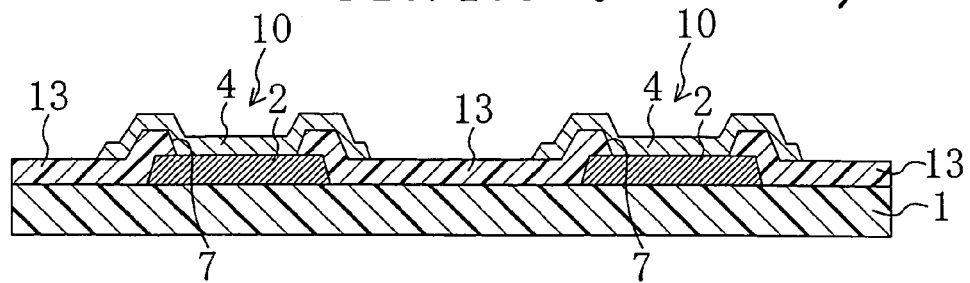
FIG. 10C is a cross-sectional view taken along line XC—XC of FIG. 10A.
Figure 11A:
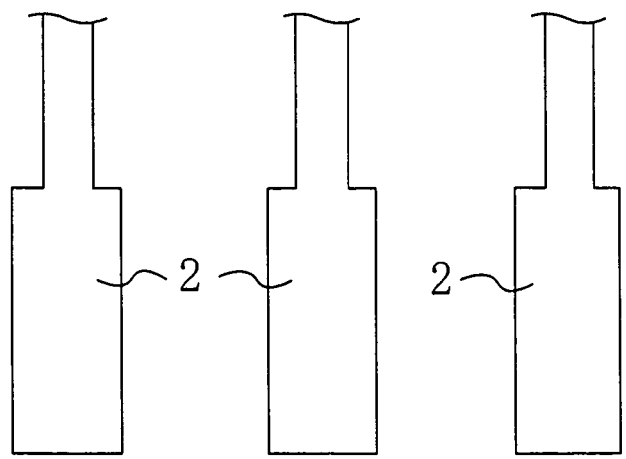
FIG. 11A to FIG. 11C are plan views illustrating the process of manufacturing the conventional active matrix substrate.
Figure 11B:
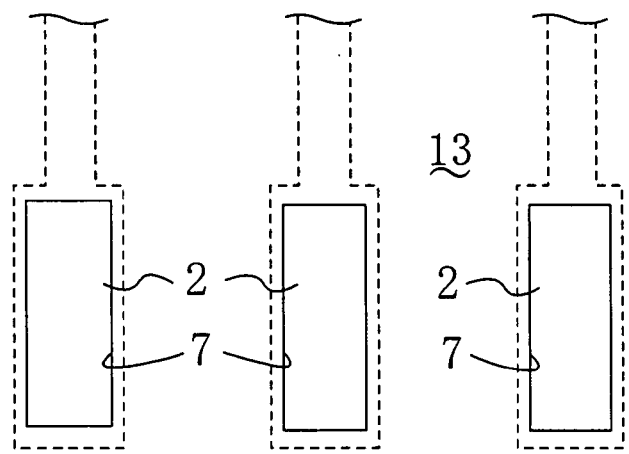
Figure 11C:
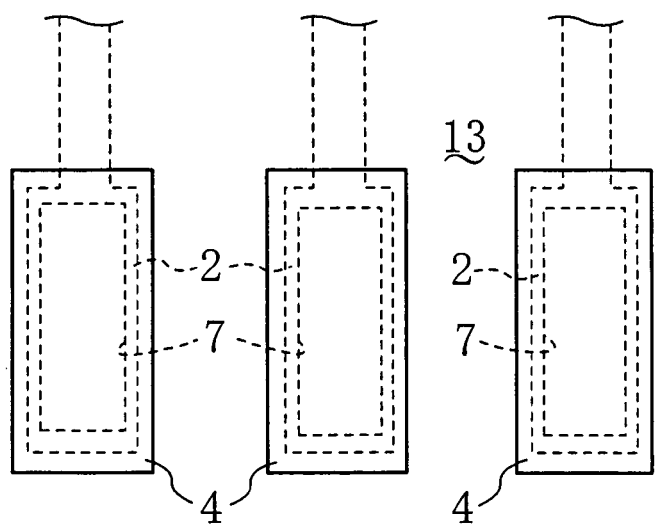
Figure 12A:
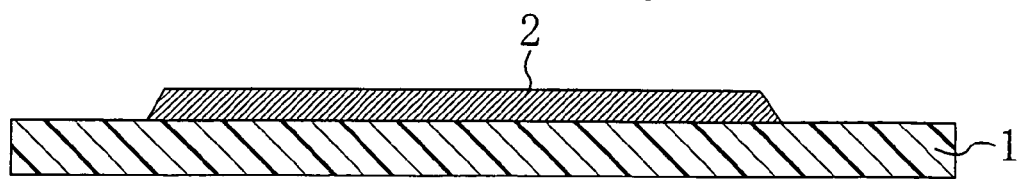
FIG. 12A to FIG. 12C are cross-sectional views taken along line XB—XB of FIG. 10A, illustrating the process of manufacturing the conventional active matrix substrate.
Figure 12B:
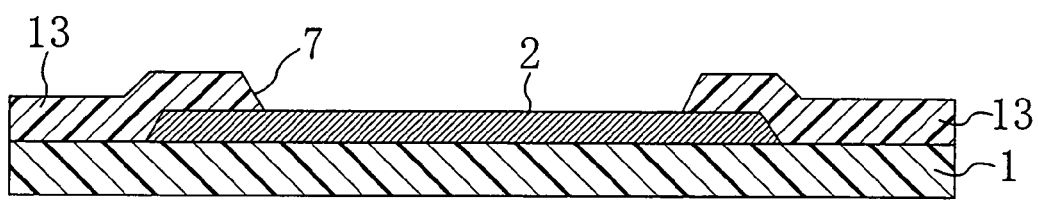
Figure 12C:
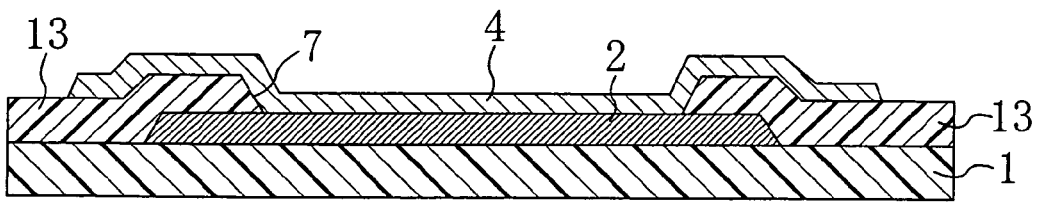
Figure 13A:
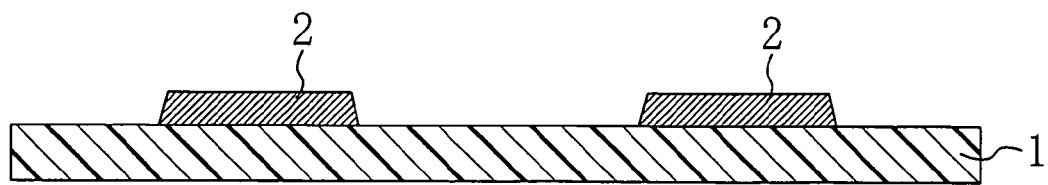
FIG. 13A to FIG. 13C are cross-sectional views taken along line XC—XC of FIG. 10A, illustrating the process of manufacturing the conventional active matrix substrate.
Figure 13B:
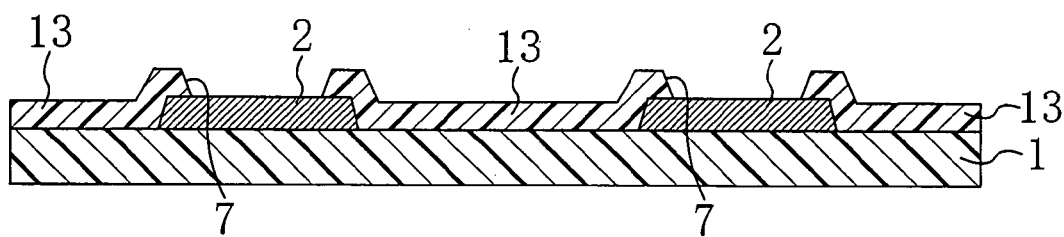
Figure 13C:
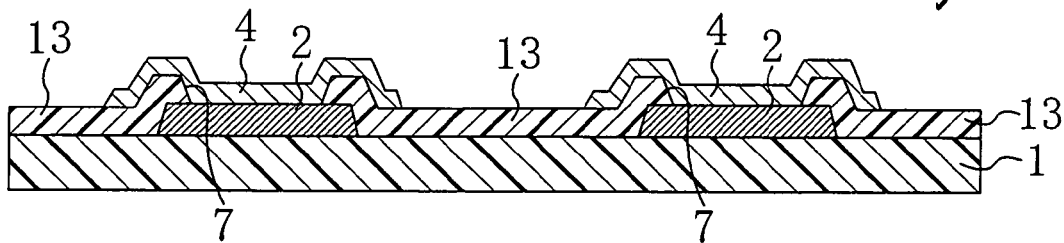

Then, as illustrated in FIG. 2B and FIG. 3B, a suitable resist pattern is formed by a photolithography method and then the structure is dry-etched with a $CF_4$—$O_2$ gas to form the strip-shaped contact hole 3 whose width is smaller than that of the line terminal forming film 2' so that the line terminal forming film 2' is exposed therethrough. Note that the strip-shaped contact hole 3 does not have to be in a complete strip-shaped pattern. When the signal input terminals 10 are arranged in a staggered pattern, for example, the contact hole 3 may be in any pattern suitable for the arrangement of the signal input terminals 10, as illustrated in FIG. 9A to FIG. 9C.

Figure 2C:
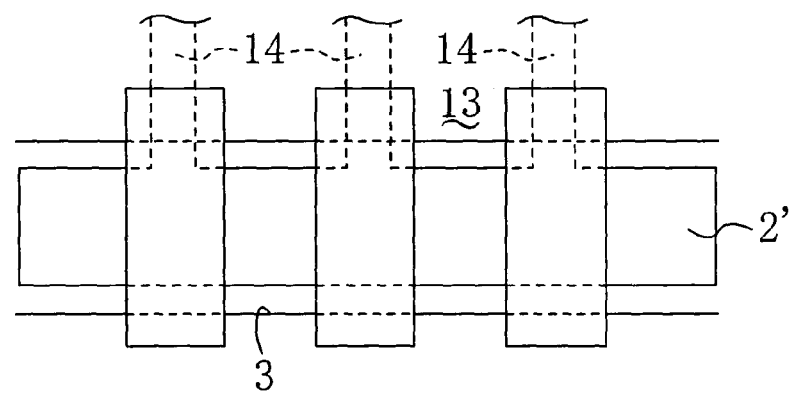
Figure 3C:
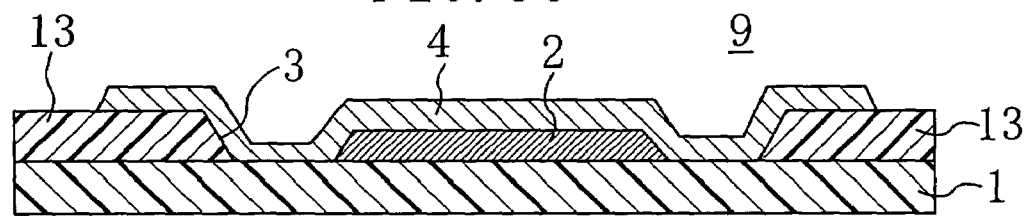
Figure 4B:
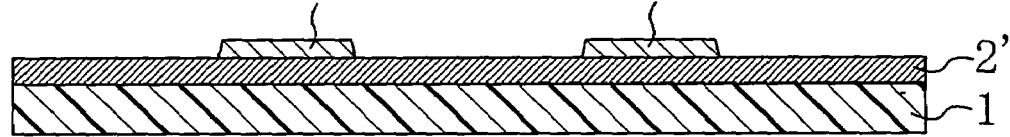

Then, Ti is deposited to a thickness of about 150 nm by a sputtering method, and the source bus lines (not shown) are formed by a photolithography method using an $HNO_3$—HF etchant, and the terminal pads 4 are also formed in this step. As illustrated in FIG. 2C, FIG. 3C and FIG. 4B, the terminal pads 4 are arranged at a regular pitch in the longitudinal direction of the line terminal forming film 2' so that each terminal pad 4 bridges over the contact hole 3 while being centered about a portion of the line terminal forming film 2' along an extension line of the corresponding gate bus line 14. With such a structure, the length of the long side of the terminal pad 4 is sufficiently larger than the width of the strip-shaped contact hole 3. Therefore, it is possible to provide a sufficient photoalignment margin for the terminal pads 4 with respect to the longitudinal direction, thereby making the process of forming the terminal pads 4 substantially free of photoalignment. In this step, a line terminal forming film similar to the line terminal forming film 2' at one end of the gate bus lines 14 is formed at one end of the source bus lines (not shown). The material of the terminal pads 4 is not limited to Ti. The material of the terminal pads 4 may be Ti, an alloy thereof, ITO (or any other suitable conductive metal oxide), Ta, Mo, Al, or an alloy thereof, or the terminal pad 4 may be a laminate of two or more of these materials. Furthermore, in Embodiment 1, the material used for the source bus lines (Ti) is used also for the gate bus lines 14, and thus the terminal pads 4 of the signal input terminals 10 for the gate bus lines 14 are made of Ti. Alternatively, a metal film used for patterning the picture element electrodes may be used for forming the terminal pads 4, as with the signal input terminals 10 for the source bus lines, as will be described later, in a case, for example, where the metal film is not substantially etched by an etchant that is used for etching a metal film of which the source bus lines are made.

Figure 2D:
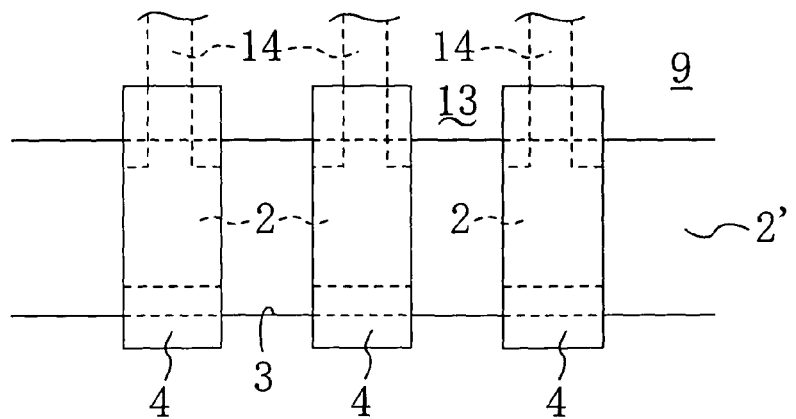
Figure 4C:
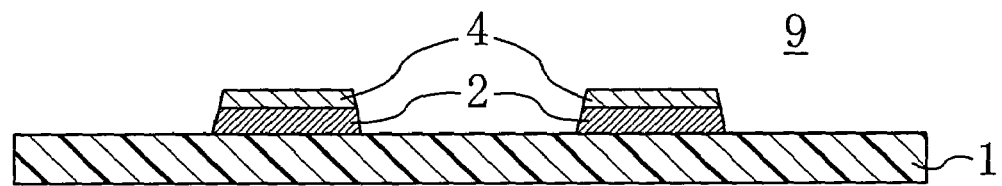

Then, as illustrated in FIG. 2D and FIG. 4C, the non-terminal-pad portions of the line terminal forming film 2' are etched away with an $HNO_3$—HF etchant by using the photopattern that is used for forming the terminal pads 4 as a mask. Thus, the signal input terminals 10 for the gate bus lines 14 are formed, each including the line terminal 2 and the terminal pad 4 deposited in this order.

Thus, the signal input terminals 10 are formed by first forming the terminal pads 4 on the strip-shaped line terminal forming film 2', and then etching away the non-terminal-pad portions of the line terminal forming-film 2' by using the terminal pads 4 themselves or the photopattern that is used for forming the terminal pads 4 as a mask. Therefore, it is possible to provide a large photoalignment margin for the terminal pads 4 with respect to the terminal arrangement direction and further to ensure a constant and sufficient contact area between the line terminals 2 and the terminal pads 4, thereby achieving a sufficiently small contact resistance therebetween. Thus, it is possible to obtain the signal input terminals 10 in which a connection defect between the line terminal 2 and the terminal pad 4 is unlikely to occur even when the insulative substrate 1 expands/contracts.

Figure 14:
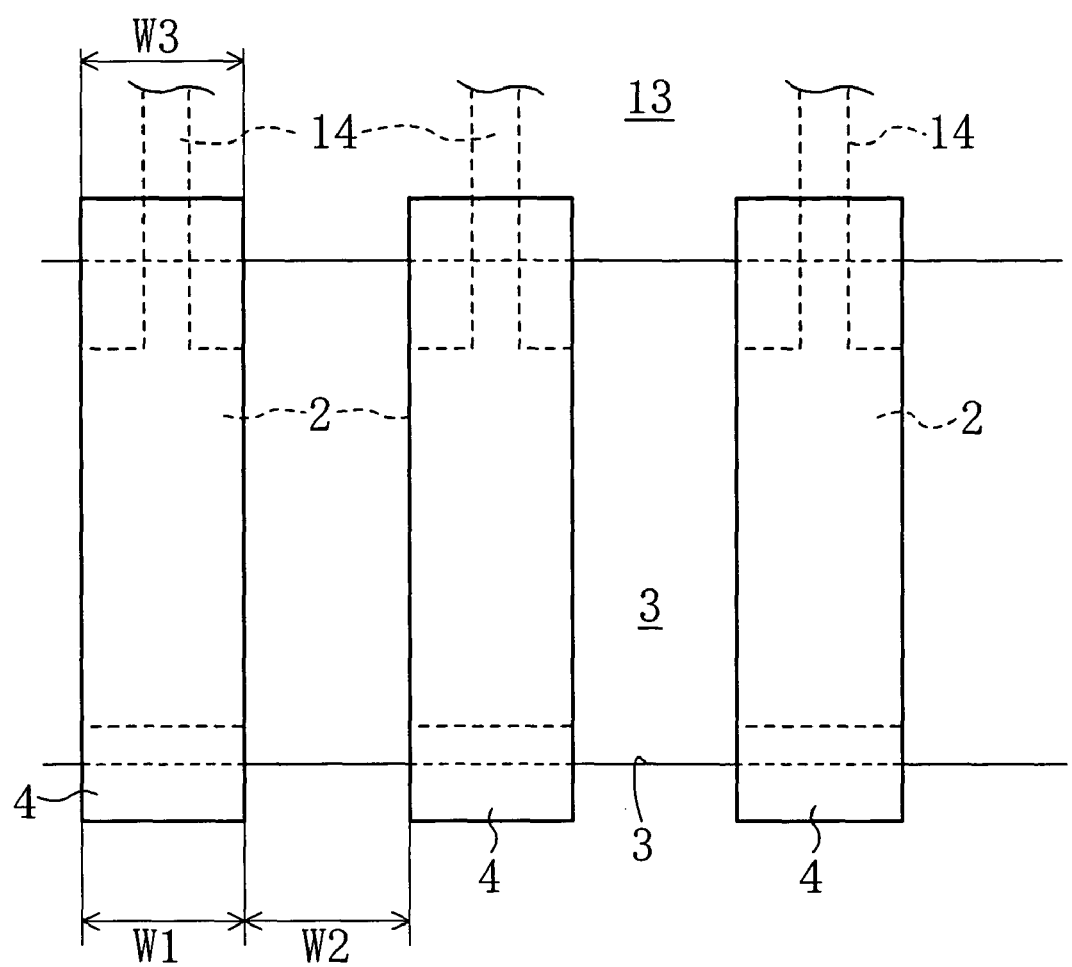
FIG. 14 is a plan view illustrating a structure satisfying a particular condition that allows for the largest photoalignment margin with the least occurrence of a mounting defect according to the present invention.
Figure 15:
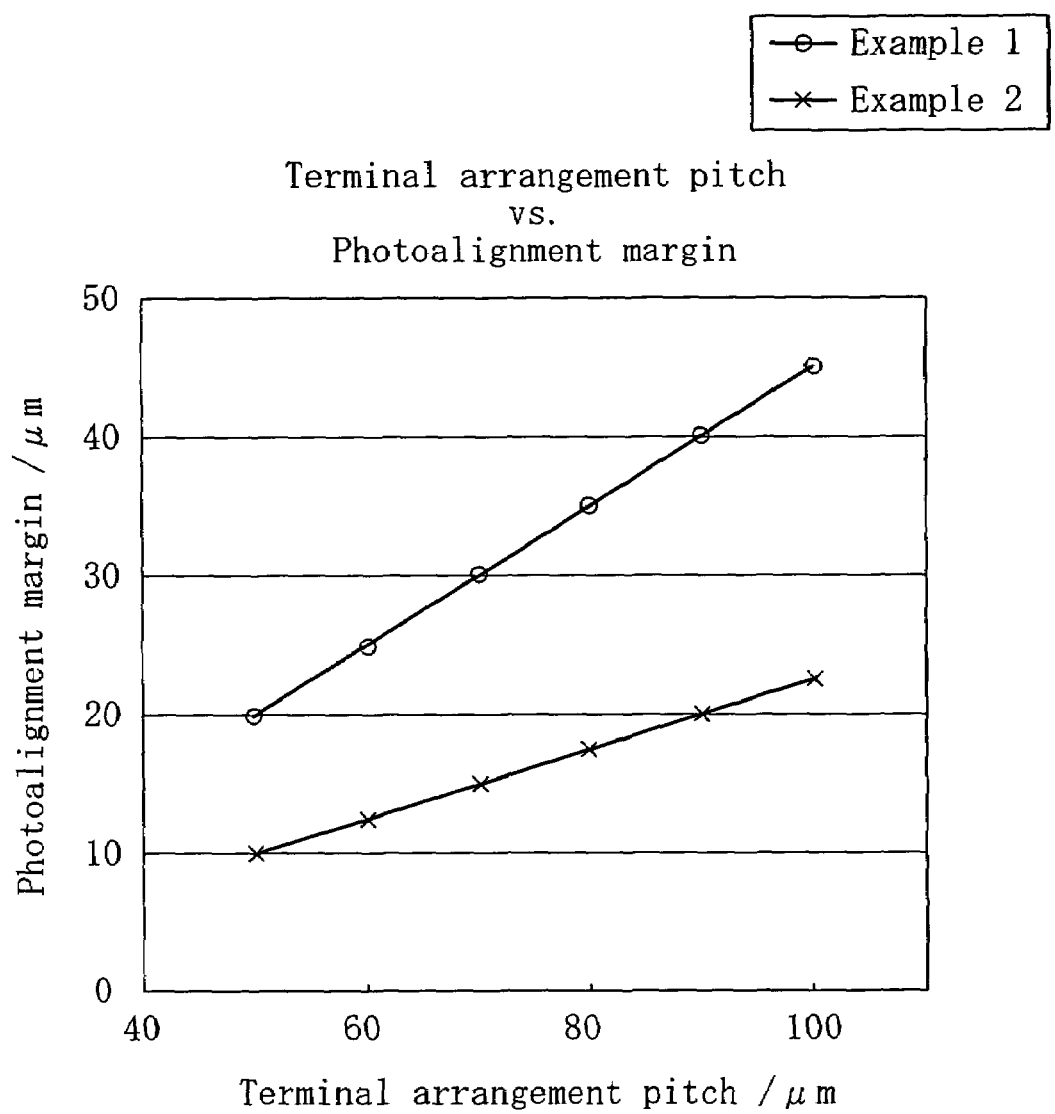
FIG. 15 is a graph illustrating the photoalignment margin (in the direction in which line terminals are arranged) of terminal pads with respect to line terminals, for various terminal pitches ranging from 50 µm to 100 µm, for the structure of the present invention, in comparison with the conventional structure.
Figure 16A:
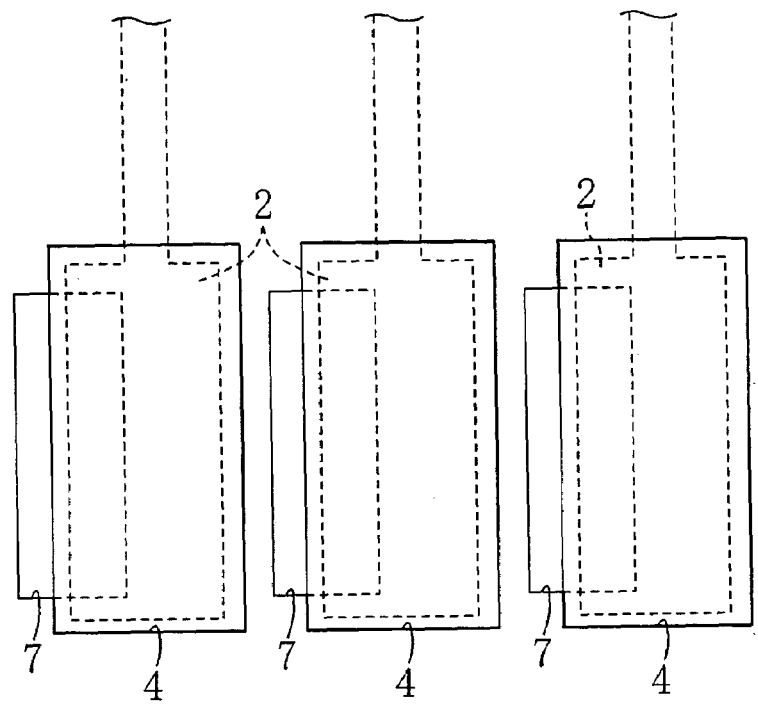
FIG. 16A is a plan view illustrating a case where contact holes are misaligned with line terminals due to expansion/contraction of an insulative substrate.
Figure 16B:
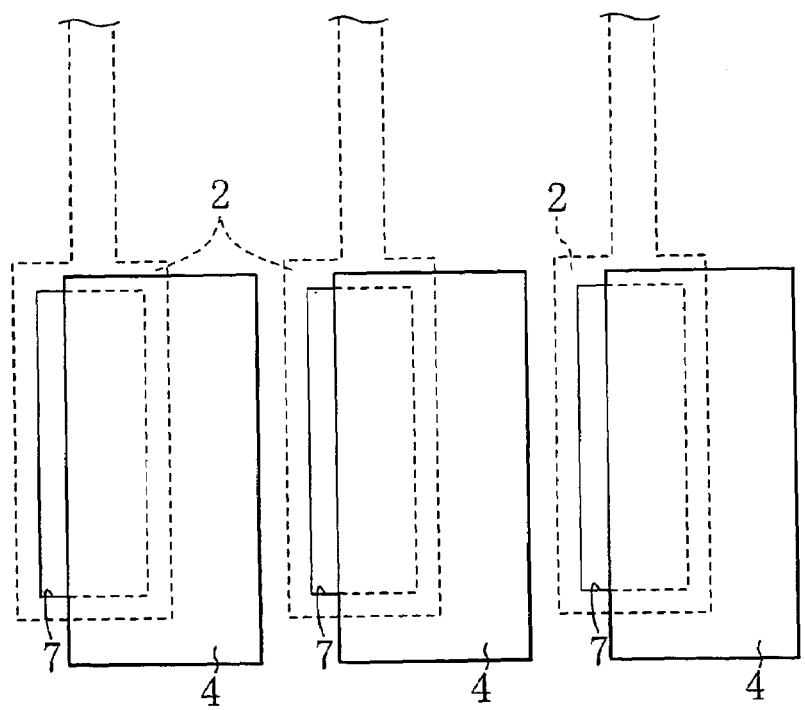
FIG. 16B is a plan view illustrating a case where terminal pads are misaligned with line terminals due to expansion/contraction of an insulative substrate.
Figure 17:
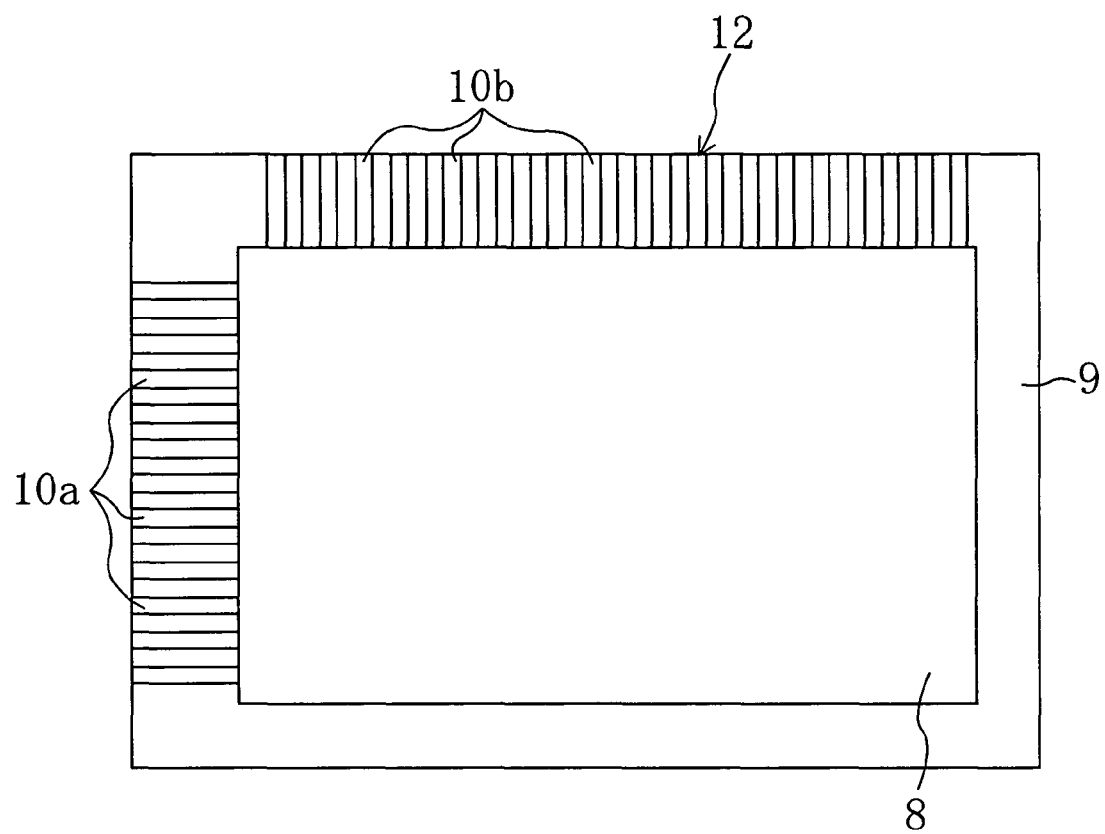
FIG. 17 is a plan view illustrating a liquid crystal display device including an active matrix substrate.

FIG. 15 is a graph illustrating the photoalignment margin (in the direction in which the line terminals 2 are arranged) of the terminal pads 4, for various terminal pitches ranging from 50 μm to 100 μm, for the active matrix substrate 9 of Embodiment 1 (Example 1), in comparison with the conventional active matrix substrate 9 (Example 2) where separate contact holes are formed for the terminal pads 4, under the same condition (Condition A). Referring to FIG. 14, Condition A is the width (W3) of each line terminal 2 being ½ of the terminal arrangement pitch (W1+W2), for example, where W1 is the width of each terminal pad 4 and W2 is the interval between adjacent terminal pads 4.

As can be seen from FIG. 15, the photoalignment margin of the active matrix substrate 9 of Embodiment 1 (Example 1) under Condition A is twice as large as that of the conventional active matrix substrate 9 (Example 2). Therefore, even in a case where the terminal arrangement pitch needs to be small because of the high definition of the liquid crystal panel, it is possible to provide a very large photoalignment margin for the terminal pads 4 with respect to the terminal arrangement direction.

Then, a channel etching process is performed by using a source pattern as a mask, and a passivation film made of SiNx is deposited by a CVD method. Then, the structure is dry-etched with a $CF_4$—$O_2$ gas after forming a suitable resist pattern by a photolithography method (not shown). In this step, a strip-shaped contact hole (not shown) is formed in the passivation film (insulating film) so that the line terminal forming film for the source bus lines is exposed therethrough.

Then, Al is deposited to a thickness of about 100 nm by a sputtering method and the Al film is patterned into picture elements by a photolithography method using an $HNO_3$—$HCl$—$CH_3COOH$ etchant. In this step, a plurality of terminal pads made of the same material as that of the picture element metal film are formed on the line terminal forming film for the source bus lines so that the terminal pads are arranged at a regular pitch in the longitudinal direction of the line terminal forming film (not shown).

Then, non-terminal-pad portions of the line terminal forming film being exposed through the strip-shaped contact hole are etched away by using the photopattern that is used for forming the terminal pads for the source bus lines as a mask. Thus, the signal input terminals for the source bus lines are formed, each including the line terminal and the terminal pad deposited in this order.

The active matrix substrate 9 of Embodiment 1 of the present invention is obtained as described above. The obtained active matrix substrate 9, together with a counter substrate, forms a liquid crystal display device, which is then built in a liquid crystal display apparatus.

Note that the insulative substrate 1 is not limited to a polyimide substrate, but may alternatively be a ceramic substrate or a plastic substrate such as a polyethylene sulfonate substrate, for example.

Embodiment 2

Figure 5A:
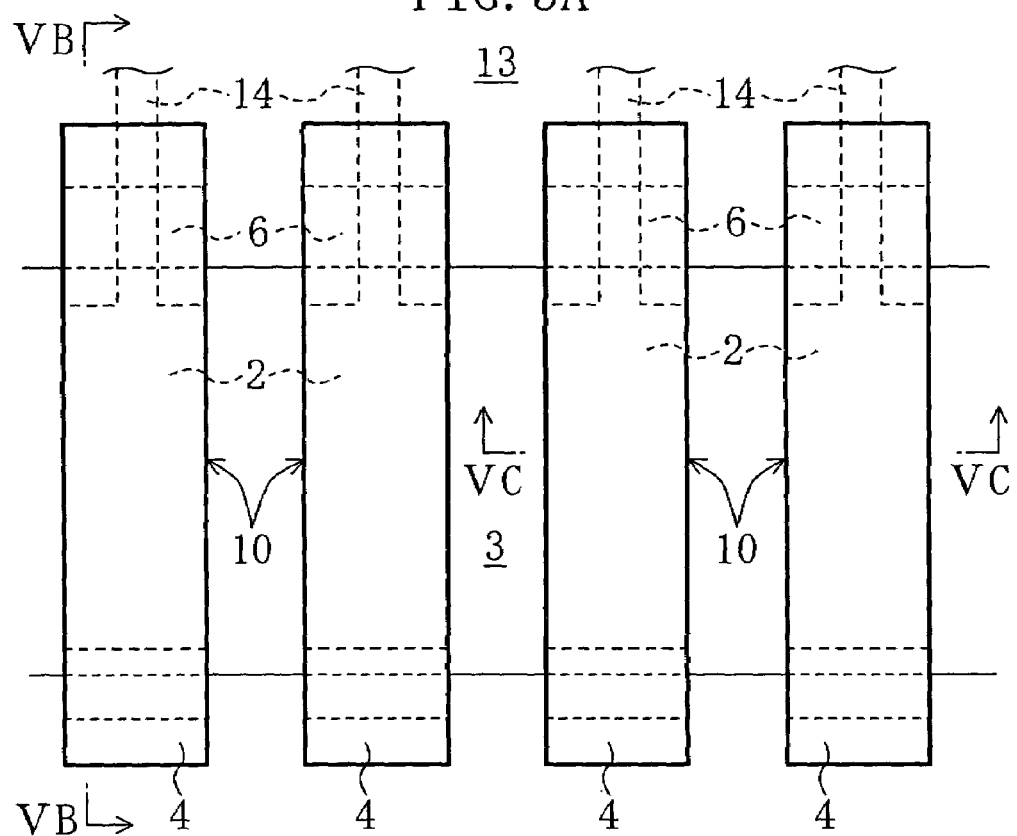
FIG. 5A is an enlarged plan view illustrating a signal input terminal section of an active matrix substrate according to Embodiment 2 of the present invention.
Figure 5B:
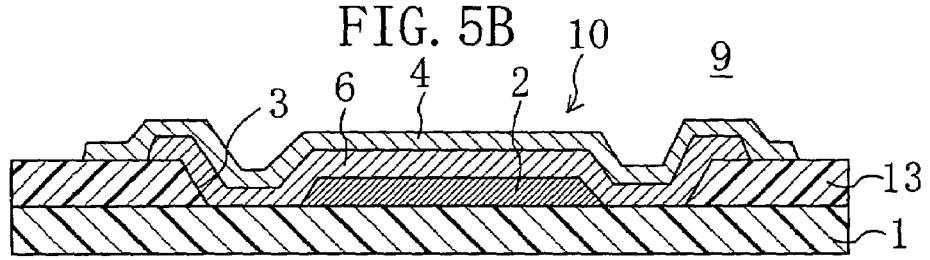
FIG. 5B is a cross-sectional view taken along line VB—VB of FIG. 5A.
Figure 5C:
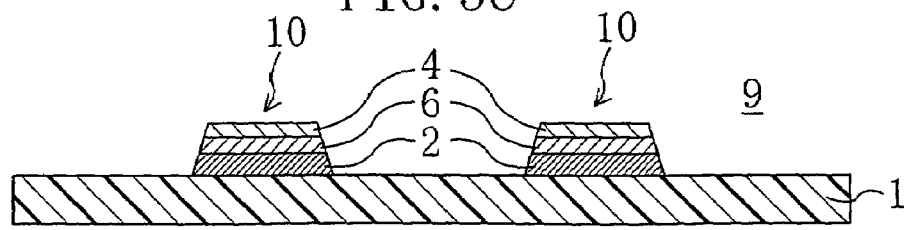
FIG. 5C is a cross-sectional view taken along line VC—VC of FIG. 5A.

The active matrix substrate 9 of Embodiment 2 of the present invention will now be described with reference to FIG. 5A, FIG. 5B and FIG. 5C, in which those components that are common to Embodiment 1 will be denoted by the same reference numerals.

The active matrix substrate 9 of the present embodiment is substantially the same in structure as that of Embodiment 1 except that the active matrix substrate 9 of the present embodiment uses a two-layer terminal pad structure including terminal pads 4 and 6, which are different metal layers (e.g., a gate metal film and a source metal film, a source metal film and a picture element metal film, or a gate metal film and a picture element metal film). In other words, the active matrix substrate 9 of the present embodiment additionally includes the lower terminal pad 6 between the line terminal 2 and the terminal pad 4, as compared with the active matrix substrate 9 of Embodiment 1.

With such a structure, even in a case, for example, where the metal film of the gate bus lines 14 is etched when etching the metal film of the source bus lines and the metal film of the source bus lines is etched when etching the metal film of the picture element electrodes, i.e., where the signal input terminals 10 need to be formed by laying three or four layers on one another with a high photoalignment precision, the lower-layer metal films can be etched by using the pattern of the uppermost layer as a mask, whereby it is possible to provide a large photoalignment margin for the terminal pads 4 with respect to the direction in which the line terminals 2 are arranged and further to ensure a constant and sufficient contact area between the line terminals 2 and the terminal pads 4, thereby achieving a sufficiently small contact resistance therebetween.

Next, the formation of the signal input terminals 10 (for the gate bus lines 14) in the method for manufacturing the active matrix substrate 9 of Embodiment 2 of the present invention will be described with reference to FIG. 6A to FIG. 6D, FIG. 7A to FIG. 7D (taken along line VB—VB of FIG. 5A) and FIG. 8A to FIG. 8D (taken along line VC—VC of FIG. 5A).

First, AlNd is deposited to a thickness of about 150 nm by a sputtering method on the insulative substrate 1 made of polyimide, and the gate bus lines 14 and storage capacitor lines (not shown) are formed by a photolithography method using an $HNO_3$—$HCl$—$CH_3COOH$ etchant. In this step, the line terminal forming film 2' is formed at one end of the gate bus lines 14. The line terminal forming film 2' is a single-piece member, which is later divided into the individual line terminals 2. Note that the material of the line terminal forming film 2' is not limited to Ti. The material of the line terminal forming film 2' may be Ti, an alloy thereof, ITO (or any other suitable conductive metal oxide), Ta, Mo, Al, or an alloy thereof, or the line terminal forming film 2' may be a laminate of two or more of these materials.

Then, the gate insulating film (350 nm) 13 made of SiNx, a channel layer (150 nm) made of a-Si and a contact layer made of $n^+$-Si are deposited by a CVD method, and the channel layer and the contact layer are patterned (not shown) by a photolithography method and dry etching using an $SF_6$ gas. Through this step, the channel layer and the contact layer on the line terminal forming film 2' are removed, leaving the gate insulating film 13 (not shown).

Figure 6A:
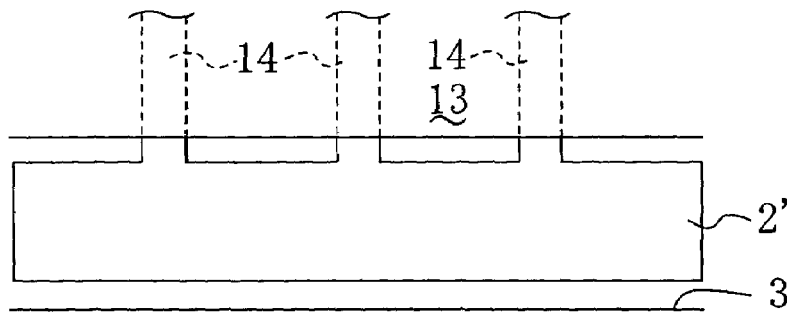
FIG. 6A to FIG. 6D are plan views illustrating the process of manufacturing the active matrix substrate according to Embodiment 2 of the present invention.
Figure 7A:
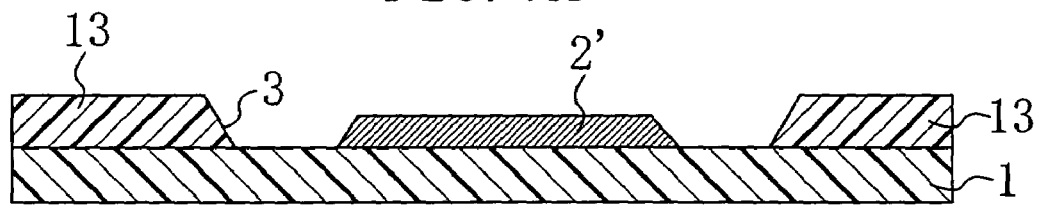
FIG. 7A to FIG. 7D are cross-sectional views taken along line VB—VB of FIG. 5A, illustrating the process of manufacturing the active matrix substrate according to Embodiment 2 of the present invention.
Figure 8A:
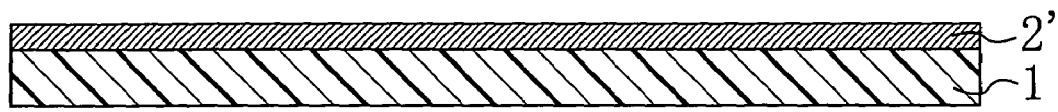

Then, as illustrated in FIG. 6A, FIG. 7A and FIG. 8A, a suitable resist pattern is formed by a photolithography method and then the structure is dry-etched with a $CF_4$—$O_2$ gas to form the strip-shaped contact hole 3 so that the line terminal forming film 2' is exposed therethrough. In this step, the strip-shaped contact hole 3 does not have to be in a complete strip-shaped pattern. For example, when the signal input terminals 10 are arranged in a staggered pattern, the contact hole 3 may be in any pattern suitable for the arrangement of the signal input terminals 10, as illustrated in FIG. 9A to FIG. 9C.

Figure 6B:
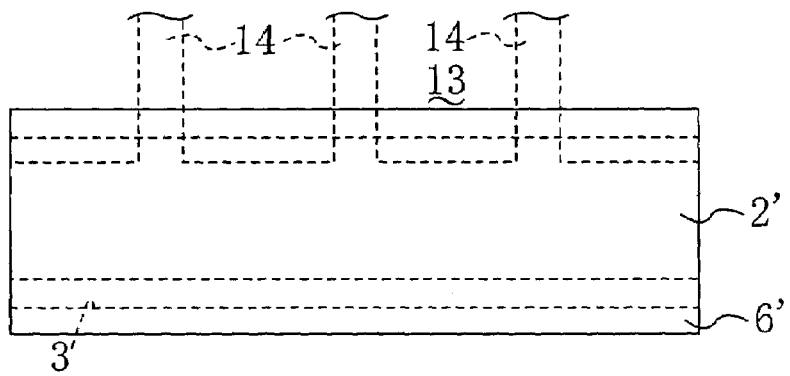
Figure 7B:
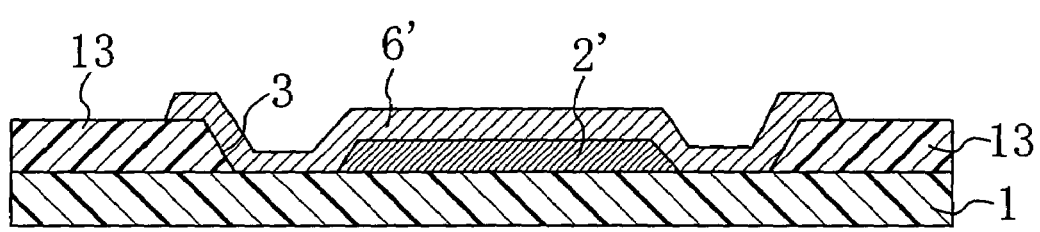
Figure 8B:
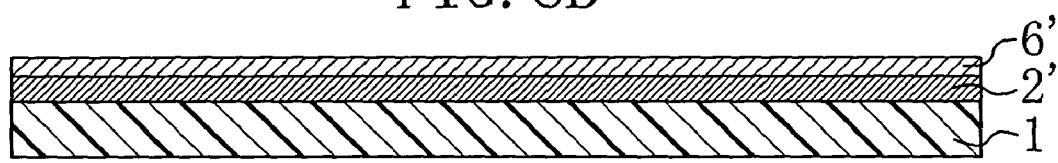

Then, Mo is deposited to a thickness of about 150 nm by a sputtering method and the source bus lines (not shown) are formed by a photolithography method using an $HNO_3$—HF etchant, and a strip-shaped lower terminal pad forming film 6' extending along the strip-shaped contact hole 3 and having a larger width than that of the strip-shaped contact hole 3 so as to cover the strip-shaped contact hole 3 is formed, as illustrated in FIG. 6B, FIG. 7B and FIG. 8B. In this step, a line terminal forming film similar to the line terminal forming film 2' at one end of the gate bus lines 14 is formed at one end of the source bus lines (not shown). Note that the material of the lower terminal pad forming film 6' is not limited to Mo. The material of the lower terminal pad forming film 6' may be Mo, an alloy thereof, ITO (or any other suitable conductive metal oxide), Ti, Ta, Al, or an alloy thereof, or the lower terminal pad forming film 6' may be a laminate of two or more of these materials.

Then, a channel etching process is performed by using a source pattern as a mask, and a passivation film made of SiNx is deposited by a CVD method. Then, the structure is dry-etched with a $CF_4$—$O_2$ gas after forming a suitable resist pattern by a photolithography method (not shown). In this step, a strip-shaped contact hole (not shown) is formed in the passivation film (insulating film) so that the line terminal forming film for the source bus lines is exposed therethrough.

Figure 6C:
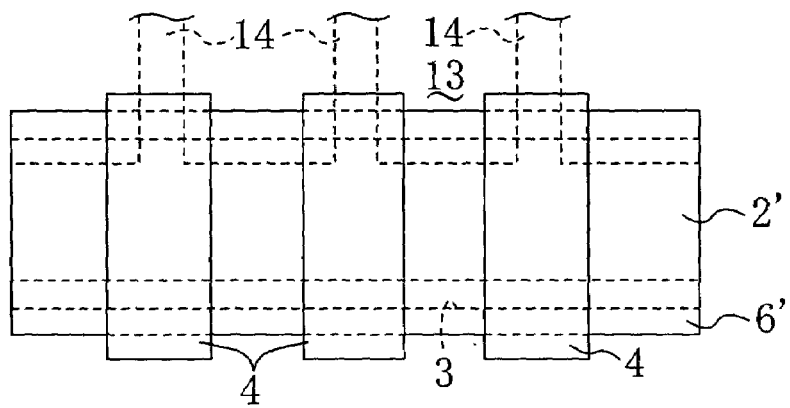
Figure 7C:
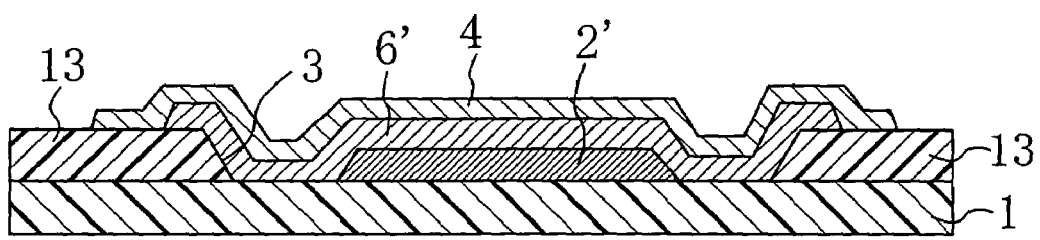
Figure 8C:
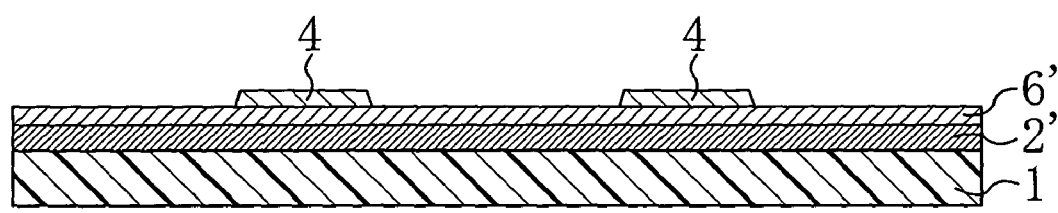

Then, Al is deposited to a thickness of about 100 nm by a sputtering method and the Al film is patterned into picture element electrodes by a photolithography method using an $HNO_3$—$HCl$—$CH_3COOH$ etchant, and the terminal pads 4 made of the same material as that of the picture element metal film and each having a rectangular shape whose long side extends in the width direction of the lower terminal pad forming film 6' are formed on the lower terminal pad forming film 6' so that the terminal pads 4 are arranged at a regular pitch in the longitudinal direction of the lower terminal pad forming film 6', as illustrated in FIG. 6C, FIG. 7C and FIG. 8C. The terminal pads 4 are formed so that the length of the long side thereof is larger than the width of the lower terminal pad forming film 6'. In this step, terminal pads made of the same material as that of the picture element metal film are also formed on the line terminal forming film for the source bus lines (not shown).

Thus, there is provided a structure where the width of the lower terminal pad forming film 6' is sufficiently larger than the width of the strip-shaped contact hole 3 and is sufficiently smaller than the length of the long side of the upper terminal pad 4, which is electrically connected to the lower terminal pad forming film 6'. With such a structure, it is possible to provide a sufficient photoalignment margin between the strip-shaped contact hole 3 and the lower terminal pad forming film 6' and between the lower terminal pad forming film 6' and the terminal pads 4.

In this case, the relationship among the width of the lower terminal pad forming film 6', the length of the long side of the terminal pad 4 and the width of the strip-shaped contact hole 3 is as follows:

the length of the long side of the terminal pad 4>the width of the lower terminal pad forming film 6'>the width of the strip-shaped contact hole 3.

Alternatively, the structure may be such that the width of the lower terminal pad forming film 6' is sufficiently larger than the width of the strip-shaped contact hole 3 and the length of the long side of the upper terminal pad 4, which is electrically connected to the lower terminal pad forming film 6', while the length of the long side of the terminal pad 4 is sufficiently larger than the width of the strip-shaped contact hole 3. Also with such a structure, it is possible to provide a sufficient photoalignment margin between the strip-shaped contact hole 3 and the lower terminal pad forming film 6' and between the lower terminal pad forming film 6' and the terminal pads 4.

In this case, the relationship among the width of the lower terminal pad forming film 6', the length of the long side of the terminal pad 4 and the width of the strip-shaped contact hole 3 is as follows:

the width of the lower terminal pad forming film 6'>the length of the long side of the terminal pad 4>the width of the strip-shaped contact hole 3.

Figure 6D:
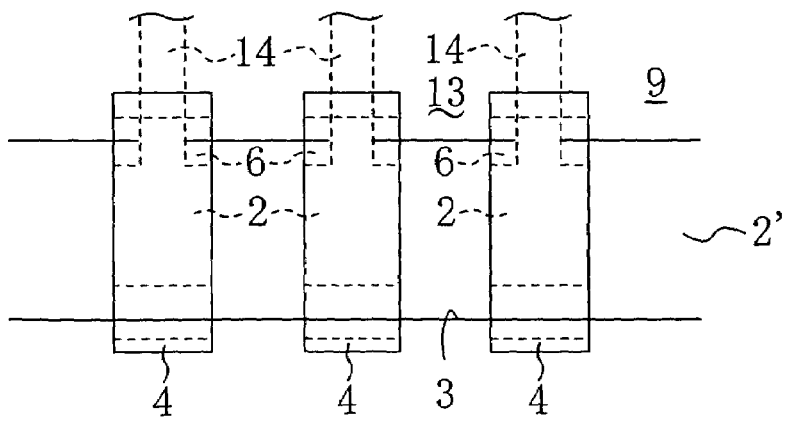
Figure 7D:
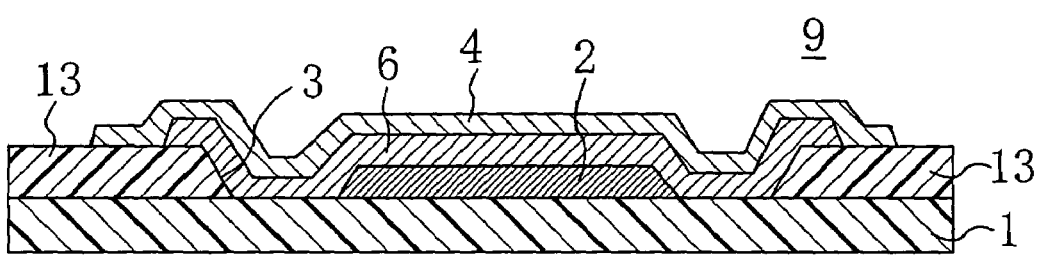
Figure 8D:
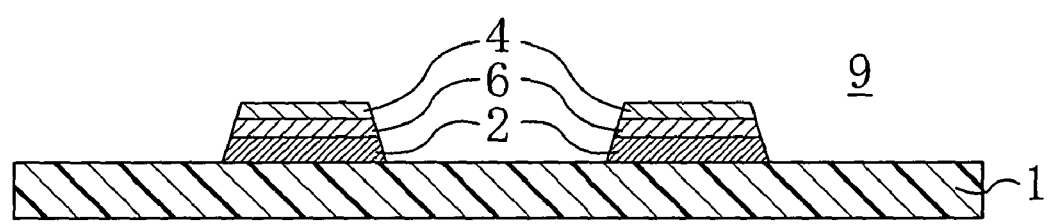

Then, as illustrated in FIG. 6D, FIG. 7D and FIG. 8D, the non-terminal-pad portions of the line terminal forming film 2' and the lower terminal pad forming film 6' are etched away with an $HNO_3$—$HCl$—$CH_3COOH$ etchant by using the photopattern that is used for forming the terminal pads 4 as a mask, thereby forming the line terminals 2 and the lower terminal pads 6 both having a rectangular shape whose long side extends parallel to that of the terminal pads 4. Thus, the signal input terminals 10 for the gate bus lines 14 are formed, each including the line terminal 2, the lower terminal pad 6 and the terminal pad 4 deposited in this order. In this step, line terminals for the source bus lines are formed (not shown) by etching away the non-terminal-pad portions of the line terminal forming film by using the photopattern that is used for forming the terminal pads for the source bus lines as a mask. Thus, signal input terminals for the source bus lines are formed, each including the line terminal, the lower terminal pad and the terminal pad deposited in this order.

For the signal input terminals 10 for the gate bus lines 14 formed as described above, the relationship among the length of the long side of the lower terminal pad 6, that of the terminal pad 4 and the width of the strip-shaped contact hole 3, and the relationship between the length of the short side (width) of the lower terminal pad 6 and that of the terminal pad 4, are as follows:

the length of the long side of the terminal pad 4>the length of the long side of the lower terminal pad 6>the width of the strip-shaped contact hole 3; and the width of the terminal pad 4=(or ≈) the width of the lower terminal pad 6.

In a case where the width of the lower terminal pad forming film 6' is sufficiently larger than the width of the strip-shaped contact hole 3 and the length of the long side of the upper terminal pad 4, which is electrically connected to the lower terminal pad forming film 6', while the length of the long side of the terminal pad 4 is sufficiently larger than the width of the strip-shaped contact hole 3, the lower terminal pads 6 are formed by etching by using the photopattern that is used for finally forming the terminal pads 4, whereby the terminal pads 4 have substantially the same shape as the lower terminal pads 6. In such a case, the relationship among the length of the long side of the lower terminal pad 6, that of the terminal pad 4 and the width of the strip-shaped contact hole 3, and the relationship between the length of the short side (width) of the lower terminal pad 6 and that of the terminal pad 4, are as follows:

the length of the long side of the terminal pad 4=(or ≈) the length of the long side of the lower terminal pad 6>the width of the strip-shaped contact hole 3; and the width of the terminal pad 4=(or ≈) the width of the lower terminal pad 6.

The active matrix substrate 9 of Embodiment 2 of the present invention is obtained as described above. The obtained active matrix substrate 9, together with a counter substrate, forms a liquid crystal display device, which is then built in a liquid crystal display apparatus.

According to the manufacturing method as described above, even in a case where the signal input terminals 10 need to be formed by laying three or four layers of metal films on one another with a high photoalignment precision, the lower metal, as in the active matrix substrate 9 of Embodiment 2 of the present invention, the lower-layer metal films can be etched by using the pattern of the uppermost layer as a mask, whereby it is possible to provide a large photoalignment margin for the terminal pads 4 with respect to the direction in which the line terminals 2 are arranged and further to ensure a constant and sufficient contact area between the line terminals 2 and the terminal pads 4, thereby achieving a sufficiently small contact resistance therebetween. Thus, it is possible to obtain the signal input terminals 10 in which a connection defect between the line terminal 2 and the terminal pad 4 is unlikely to occur even when the insulative substrate 1 expands/contracts.

Also in a case where the signal input terminals 10 for the gate bus lines 14 are formed in a multi-layer terminal structure including two or more different layers of metal films, as the lower terminal pad 6 and the terminal pad 4 of the active matrix substrate 9 according to Embodiment 2 of the present invention, which is manufactured as described above, the signal input terminals 10 can be formed with the same photoalignment margin as that shown in FIG. 15 by employing a structure similar to that described above in Embodiment 1 with reference to FIG. 14.

Note that the insulative substrate 1 is not limited to a polyimide substrate, but may alternatively be a ceramic substrate or a plastic substrate such as a polyethylene sulfonate substrate, for example.

While the present invention has been described in preferred embodiments, it will be apparent to those skilled in the art that the disclosed invention may be modified in numerous ways and may assume many embodiments other than those specifically set out and described above. Accordingly, it is intended by the appended claims to cover all modifications of the invention that fall within the true spirit and scope of the invention.

The invention claimed is:

1. An active matrix substrate including a plurality of spaced-apart signal input terminals for providing connection to a driver, the active matrix substrate comprising:
    an insulative substrate;
    a plurality of spaced-apart conductive line terminals provided on the insulative substrate;
    an insulating film provided on a layer of the line terminals on the insulative substrate and including a contact hole extending in a terminal arrangement direction so that the plurality of line terminals are exposed therethrough;
    a plurality of conductive terminal pads provided on a layer of the insulating film on the insulative substrate so as to respectively cover the plurality of line terminals exposed through the contact hole in the insulating film, so that a plurality of the conductive line terminals and a plurality of the conductive terminal pads are provided for a single contact hole, and
    wherein the signal input terminals each include one of the line terminals and a corresponding one of the terminal pads.

2. The active matrix substrate of claim 1, wherein a length of each terminal pad in a direction perpendicular to the terminal arrangement direction is larger than a width of the contact hole.

3. The active matrix substrate of claim 1, wherein side edges of the line terminal of each signal input terminal opposing each other in the terminal arrangement direction are aligned with those of the terminal pad of the signal input terminal.

4. The active matrix substrate of claim 1, wherein the insulative substrate is a plastic substrate.

5. A liquid crystal display apparatus, comprising an active matrix substrate including a plurality of spaced-apart signal input terminals for providing connection to a driver, the active matrix substrate including:
    an insulative substrate;
    a plurality of spaced-apart conductive line terminals provided on the insulative substrate;
    an insulating film provided on a layer of the line terminals on the insulative substrate and including a contact hole extending in a terminal arrangement direction so that the plurality of line terminals are exposed therethrough;
    a plurality of conductive terminal pads provided on a layer of the insulating film on the insulative substrate so as to respectively cover the plurality of line terminals exposed through the contact hole in the insulating film, so that a plurality of the conductive line terminals and a plurality of the conductive terminal pads are provided for a single contact hole, and
    wherein the signal input terminals each include one of the line terminals and a corresponding one of the terminal pads.

6. The liquid crystal display apparatus of claim 5, wherein a length of each terminal pad in a direction perpendicular to the terminal arrangement direction is larger than a width of the contact hole.

7. The liquid crystal display apparatus of claim 5, wherein side edges of the line terminal of each signal input terminal opposing each other in the terminal arrangement direction are aligned with those of the terminal pad of the signal input terminal.

8. The liquid crystal display apparatus of claim 5, wherein the insulative substrate is a plastic substrate.

9. An active matrix substrate comprising:
    an insulative substrate;
    a plurality of spaced-apart conductive line terminals provided on the insulative substrate;
    an insulating film provided over at least the line terminals on the insulative substrate;
    a contact hole defined in the insulating film and extending in a terminal arrangement direction so that the plurality of line terminals are entirely exposed therethrough;
    a plurality of conductive terminal pads provided over at least the insulating film so as to respectively cover the plurality of line terminals exposed through the contact hole in the insulating film, so that a plurality of the conductive line terminals and a plurality of the corresponding conductive terminal pads are provided for a single contact hole.

10. The active matrix substrate of claim 9, wherein a length of each terminal pad in a direction perpendicular to the terminal arrangement direction is larger than a width of the contact hole.

* * * * *